United States Patent [19]

Blouke et al.

[11] Patent Number: 4,923,825

[45] Date of Patent: May 8, 1990

[54] METHOD OF TREATING A SEMICONDUCTOR BODY

[75] Inventors: Morley M. Blouke; Thaian N. Tran; Marjorie L. Lust, all of Beaverton, Oreg.

[73] Assignee: Tektronix, Inc., Beaverton, Oreg.

[21] Appl. No.: 345,747

[22] Filed: May 1, 1989

[51] Int. Cl.⁵ .................... H01L 21/70; H01L 21/60; H01L 21/00

[52] U.S. Cl. ...................... 437/53; 437/209; 437/213; 357/80; 357/24

[58] Field of Search ............ 437/53, 209, 213; 357/80, 24 LR

[56] References Cited

U.S. PATENT DOCUMENTS 4,251,909 2/1981 Hoeberechts ................ 437/209
4,422,091 12/1983 Liu ............................ 357/24 LR
4,716,447 12/1987 Savoye ........................ 357/24 LR

FOREIGN PATENT DOCUMENTS 61-59824 3/1986 Japan .

Primary Examiner—Brian E. Hearn
Assistant Examiner—Laura Holtzman
Attorney, Agent, or Firm—John Smith-Hill; Peter J. Meza

[57] ABSTRACT

A semiconductor body is treated by providing a layer of dielectric material over a peripheral region of the front face of the body, mounting the body on a support member with the front face of the body in confronting relationship with the support member, and removing material of the body in the peripheral region, so as to expose at least a portion of the layer of dielectric material. A layer of metal is formed on the back face of the body and is connected to an electrical terminal.

8 Claims, 2 Drawing Sheets

METHOD OF TREATING A SEMICONDUCTOR BODY

BACKGROUND OF THE INVENTION

This invention relates to a method of treating a semiconductor body.

A charge-coupled device (CCD) may be made by processing a silicon wafer of p conductivity using conventional MOS technology to form a plurality of buried channels of n conductivity beneath the front surface of the wafer (the surface through which the wafer is processed). Each channel is made up of a linear array of like elementary zones. A clocking electrode structure overlies the front surface of the wafer, and by application of selected potentials to gate electrodes that form the clocking electrode structure, charge present in a given elementary zone of a channel may be advanced through the linear array of elementary zones, in the manner of a shift register, and extracted from the channel. Charge may be generated in the channels photoelectrically. Thus, if electromagnetic radiation enters the wafer it may cause generation of conduction electrons and these conduction electrons may become confined in one of the elementary zones.

A CCD may be used to generate an electrical signal representative of the distribution of light intensity over the channel region of the CCD. In such an imaging CCD, it is desirable that the thickness of the die be not much greater than the depth of the interface between the channels and the substrate. This may be achieved by securing the wafer at its front surface to a reinforcing member, and thinning the wafer from its back surface. The terminals of the electrode structure are covered by the reinforcing member. Electrical contact is made to the terminals of the electrode structure via conductor runs that extend from the terminals to bond pads on an exposed surface region on the reinforcing member. A method of providing such conductor runs is described in co-pending patent application Ser. No. 07/114,884 filed Oct. 29, 1987.

In operation of a CCD, the substrate is typically held at a ground potential level, and the gate electrodes of the clocking electrode structure are clocked between voltages of approximately $-5$ to $+15$ volts relative to ground. In order to hold the substrate at ground, a substrate contact is formed on the front surface of the wafer, outside the channel region. In order to provide an ohmic contact between the substrate contact and the substrate, boron may be implanted into the substrate where the substrate contact is to be formed. The substrate contact may be in multiple segments about the periphery of the channel region, with each segment connected to a bond pad on the reinforcing member in similar fashion to that in which connections are made to the terminals of the electrode structure. The various segments of the substrate contact are spaced from one another in order to permit conductor runs to pass from the terminals of the electrode structure to their bond pads.

It has been found that defects in the wafer are associated with the substrate contact. As the wafer is thinned by etching, pits appear over the substrate contact and lead to a more rapid etching of the silicon in those regions than elsewhere. Also, relatively large chunks of silicon frequently lift out of the substrate over the substrate contact, exposing the contact metal and reflow glass deposited over the front surface of the wafer. These materials etch rapidly in the etchants used to thin the wafer, severely undercutting the CCD and rendering it unusable.

It is known to deposit metal over the back surface of the channel region of a backside illuminated imaging CCD and to remove portions of the metal by etching, while leaving metal over other portions of the back surface. This metal is provided to shield selected areas of the channel region from illumination and does not serve an electrical purpose in connection with operation of the CCD.

SUMMARY OF THE INVENTION

A preferred embodiment of the present invention in a first aspect is a method of treating a semiconductor body having a front face and a back face, comprising the steps of providing a layer of dielectric material over a peripheral region of the front face of the body, mounting the body on a support member, with the front face of the body in confronting relationship with the support member, and removing material of the body in the peripheral region, so as to expose at least a portion of the layer of dielectric material. A layer of metal is formed on the back face of the body and is connected to an electrical terminal.

A preferred embodiment of the present invention in a second aspect is a method of treating a semiconductor body having a front face and a back face, and having a charge-coupled device formed therein over a selected area of the front face. The method comprises the steps of mounting the body on a support member, with the front face of the body in confronting relationship with the support member, thinning the body by way of its back face, forming a layer of metal on the back face of the thinned body, the layer of metal not extending over that area of the back face which directly overlies the selected area of the front face, and connecting the layer of metal to an electrical terminal.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
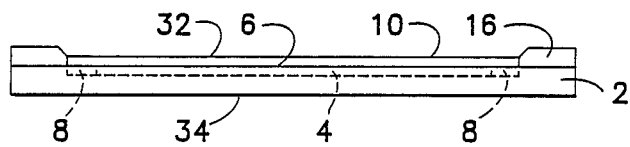
FIG. 1 is a simplified sectional view of a semiconductor die having a CCD fabricated therein.
Figure 2:
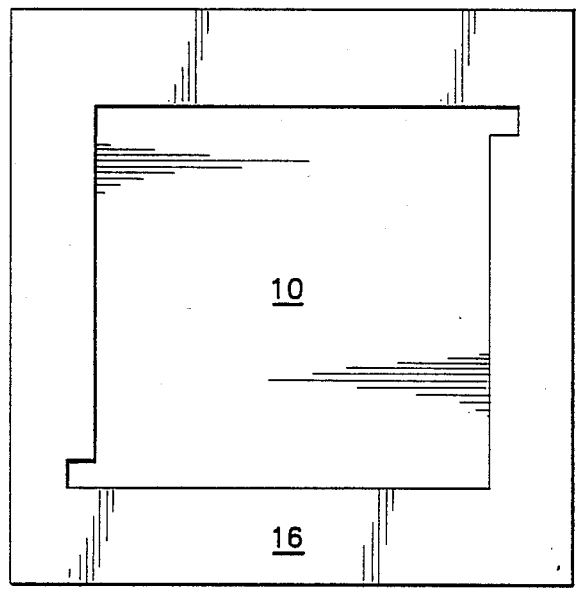
FIG. 2 is a simplified top plan view of the die.

FIGS. 1–7 illustrate fabrication of an imaging CCD. FIGS. 1 and 2 show a silicon die 2 which has been processed in conventional fashion to form a channel region 4 which extends partly into the die from the front surface 6 thereof. The channel region may contain many separate channels, but these are not separately shown because the present invention is not directly concerned with the manner of operation of the CCD. As shown in FIG. 2, the channel region is generally rectangular, but has appendages 8 in which output amplifiers are formed. Die 2 is about 0.5 mm thick, and the interface between the channel region and the substrate is at a depth in the range from about 0.5 μm to about 1.5 μm below the front surface of the die. A polysilicon electrode structure 10 is formed over the channel region. Electrode structure 10 is illustrated as a continuous layer, but it will be understood by those skilled in the art that it would in fact comprise numerous distinct gate electrodes and other portions. It will also be appreciated that although a single layer is shown, electrode structure 10 could be composed of more than one layer.

Each output amplifier has an output terminal 12 (FIG. 3) constituted by part of the electrode structure 10. Output terminal 12 may be the source electrode of a FET. The output terminal has an extension 14 which extends over the field oxide 16 that surrounds channel region 4. An aperture 18 is formed in field oxide 16, and a polysilicon pad 20 which contacts die 2 outside the channel region is formed in this aperture when polysilicon electrode structure 10 is formed over channel region 4. Metallization 22 extends over terminal extension 14, field oxide 16 and polysilicon pad 20 in order to establish electrical connection between terminal 12 and pad 20. Similar connection structures are provided around the margin of the die for other terminals of the electrode structure.

Figure 3:
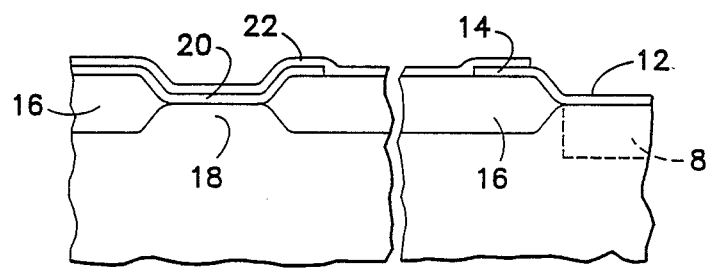
FIG. 3 is a more detailed enlarged sectional view of a part of the die.
Figure 4:
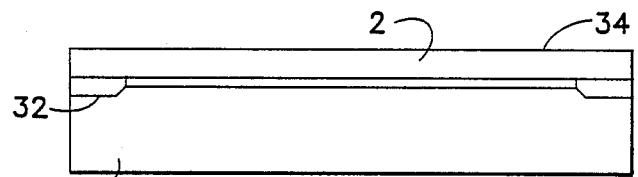
FIG. 4 is a simplified sectional view of the die when adhered to a support member.
Figure 5:
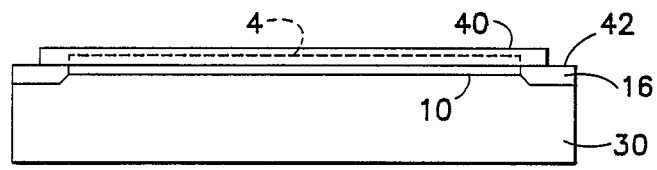
FIG. 5 is a view similar to FIG. 4 after thinning of the die.
Figure 6:
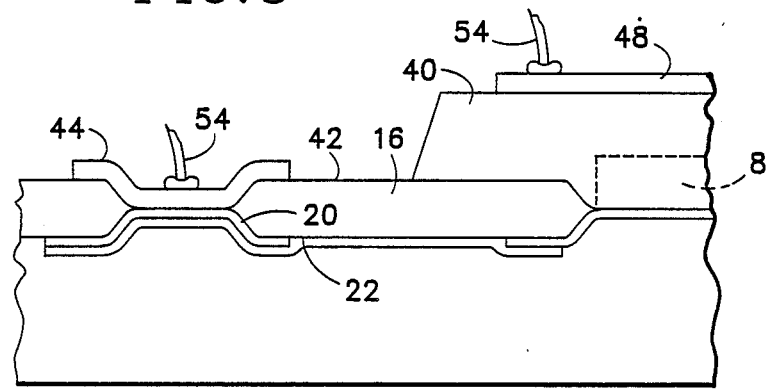
FIG. 6 is an enlarged sectional view of the die after further processing.

A support member 30 of high silica borosilicate glass is formed over the front surface 32 of the FIGS. 1-3 structure in the manner described in patent application Ser. No. 07/018,832, filed Feb. 24, 1987. In FIG. 4, die 2 is shown inverted with respect to FIG. 1 and on top of support member 30. Support member 30 is bonded directly to structure 32, i.e. there is no intermediate bonding material, such as wax, between support member 30 and structure 32. The die is thinned by etching from its back surface 34 to a thickness of about 8-16 μm. Using conventional photolithographic techniques, a mask is formed over the channel region, and the region of the thinned die that remains exposed is removed by etching. The etching operation is controlled so that field oxide 16 and polysilicon pad 20 are not removed. Thus, as shown in FIG. 5, a silicon island 40, including channel region 4, projects upwardly from field oxide 16 and is surrounded by a peripheral surface 42 of field oxide 16. The area overlying the channel region, not including amplifier appendages 8, is the optically active region of the CCD, and receives incident light like the CCD is in use.

Figure 7:
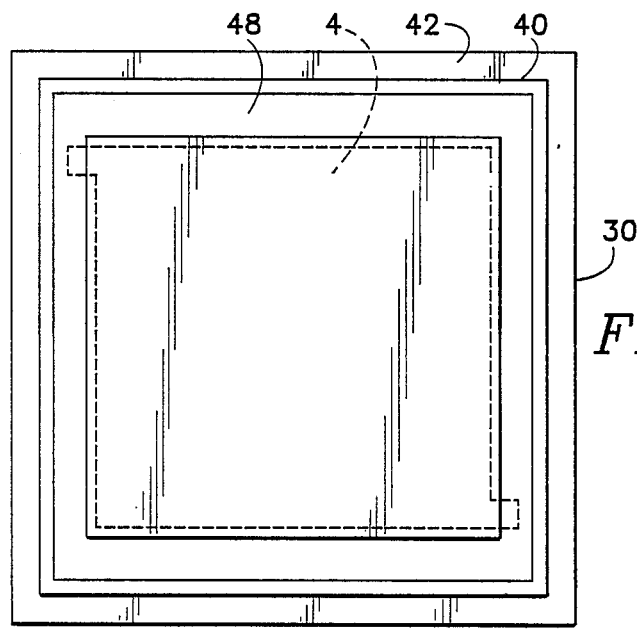
FIG. 7 is a top plan view of the die shown in FIG. 6.
Figure 8:
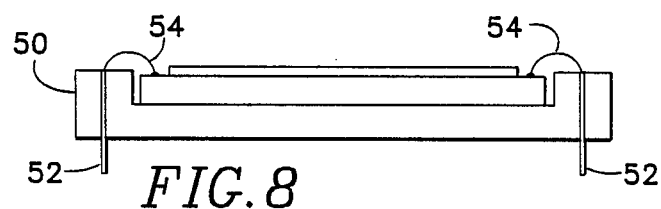
FIG. 8 is a sectional view illustrating the processed die mounted in a container.

Aluminum is deposited over the top surface of the structure shown in FIG. 5 and is patterned to define an aluminum bond pad 44 (FIG. 6) over polysilicon pad 20, and an aluminum substrate contact 48 on the back surface of island 40. As shown in FIG. 7, substrate contact 48 is continuous and extends around the periphery of channel region 4 and therefore does not block light incident on the light-collecting region of the CCD. Bond pad 44 is then alloyed to polysilicon pad 20, and concurrently substrate contact 48 is alloyed to island 40. The processed die and its support member are mounted in a container 50 having an open top through which the back surface of the die is exposed. Container 50 is made of dielectric material and carries electrical connection pins 52. Bond pad 44 and substrate contact 48 are connected to two of the pins 52 by bond wires 54. When container 50 is installed in appropriate electrical apparatus, pins 52 and bond wires 54 serve to connect substrate contact 48 to a reference potential level and bond pad 44 to the input terminal of an instrument for utilizing the signal provided at terminal 12.

By providing the substrate contact in the manner described with reference to FIGS. 1-7, the photoprocessing steps required to provide a substrate contact on the front surface of the die are eliminated. The substrate contact is provided on the back surface of the silicon island concurrently with providing the bond pads on the margin of the support member, and therefore no additional photoprocessing step is required.

Preferably, substrate contact 48 completely covers amplifier appendages 8. In this manner, a "hard" ground, i.e., a ground that is not affected by substrate currents of the magnitude that occur in the CCD, is established over the amplifier appendages. Contact 48 may be configured to shield selected portions on the CCD, e.g. the memory of a frame transfer device, from incident light.

It will be appreciated that the invention is not restricted to the particular embodiment that has been described, and that variations may be made therein without departing from the scope of the invention as defined in the appended claims and equivalents thereof. For example, boron may be implanted into island 40 by way of its back surface in order to ensure ohmic contact between the substrate and the substrate contact. The optically active region of the wafer is masked from the boron implant. Also, although the invention has been described with reference to a p conductivity die having a channel region of n conductivity formed therein, it is applicable to an n conductivity die having a channel region of p conductivity.

We claim:

1. A method of treating a semiconductor body having a front face and a back face, comprising the steps of:
    (a) providing a layer of dielectric material having at least one aperture over a peripheral region of the front face of the body and depositing conductive material in the aperture so that the layer of metal on the exposed dielectric material contacts the conductive material,
    (b) mounting the body on a support member, with the front face of the body in confronting relationship with the support member,
    (c) removing material of the body in the peripheral region, so as to expose at least a portion of the layer of dielectric material,
    (d) forming a layer of metal on the back face of the body and a layer of metal on the exposed dielectric material, the layer of metal on the back face of the body being electrically separate from the layer of metal on the exposed dielectric material and removing metal from a selected are of the exposed dielectric material, without removing the metal that overlies the conductive material, and
    (e) connecting the layer of metal on the back face of the body to an electrical terminal.

2. A method according to claim 1, comprising connecting the metal that overlies the conductive material to a second electrical terminal.

3. A method according to claim 1, wherein step (d) comprises depositing a single continuous layer of metal on the back face of the body and the exposed dielectric material, and selectively removing metal of the single continuous layer.

4. A method according to claim 1, further comprising, between steps (d) and (e):
removing metal from a selected area of the back face of the body, and wherein step (e) comprises connecting the metal that remains on the back face of the body to the electrical terminal.

5. A method according to claim 4, wherein the semiconductor body has an optically active region surrounded by said peripheral region, and the step between step (d) and step (e) comprises removing metal over the optically active region.

6. A method according to claim 1, further comprising, between steps (b) and (c), thinning the body by way of its back face.

7. A method of treating a treating a semiconductor body having a front face and a back face and having a charge-coupled device formed therein over a selected area of the front face, said method comprising the steps of:
mounting the body on a support member, with the front face of the body in confronting relationship with the support member,
thinning the body by way of its back face,
forming a layer of metal on the back face of the thinned body, said layer of metal not extending over that area of the back face which directly overlies said selected area of the front face, and
connecting the layer of metal to an electrical terminal.

8. A method of treating a semiconductor body having a front face and a back face, comprising the steps of:
(a) providing a layer of dielectric material over a peripheral region of the front face of the body,
(b) mounting the body on a support member, with the front face of the body in confronting relationship with the support member,
(c) removing material of the body in the peripheral region, so as to expose at least a portion of the layer of dielectric material,
(d) forming a layer of metal on the back face of the body, and
(e) bonding a wire to the layer of metal on the back face of the body.

* * * * *